United States Patent

Chalco et al.

[11] Patent Number: 6,029,881
[45] Date of Patent: Feb. 29, 2000

[54] MICRO-SCALE PART POSITIONING BY SURFACE INTERLOCKING

[75] Inventors: Pedro A. Chalco, Yorktown Heights; Bruce Kenneth Furman, Beacon; Raymond Robert Horton, Dover Plains; Chandrasekhar Narayan, Hopewell Junction, all of N.Y.

[73] Assignee: International Business Machines Corporation, Armonk, N.Y.

[21] Appl. No.: 08/796,405

[22] Filed: Feb. 6, 1997

[51] Int. Cl.[7] .................................................. H01L 21/00
[52] U.S. Cl. ........................ 228/110.1; 228/119; 228/29
[58] Field of Search ................... 228/110.1, 119, 228/29

[56] References Cited

U.S. PATENT DOCUMENTS

| | | | |
|---|---|---|---|
| 5,079,070 | 1/1992 | Chalco et al. | 428/209 |
| 5,193,732 | 3/1993 | Interrante et al. | 228/1.1 |
| 5,289,632 | 3/1994 | Chalco et al. | 29/846 |

OTHER PUBLICATIONS

"Replacement of Missing Solder Balls by Transient Wetting Transfer" IBM Technical Disclosure Bulletin vol. No. Pages.

Copending Patent Application Ser. No. Filed Apr. 29, 1996 (IBM Docket No. Y0995–053) "TFT/LCD Active Data Line Repair"–Inventors Alt et al.

*Primary Examiner*—Patrick Ryan
*Assistant Examiner*—M. Alexandra Elve
*Attorney, Agent, or Firm*—Daniel P. Morris; Alvin J. Riddles

[57] ABSTRACT

A principle of surface interlocking wherein the imperfections of two parallel surfaces deform and interlock under pressure. The surface interlocking enables the combination of a bridging element and a bonding tip of a diffusion bonding apparatus to pick up, transport, position at a unique location, and bond the bridging element in place to the conductors or pads. In the invention a single point bonding tip as part of a bonding apparatus is used to pick up the, to be, bridging metal object transport it to the bonding site and perform the entire bridging bonding operation all in one sequence of steps.

16 Claims, 1 Drawing Sheet

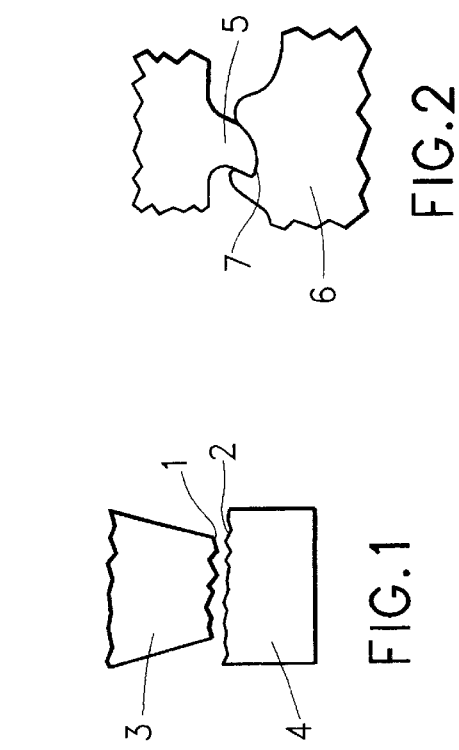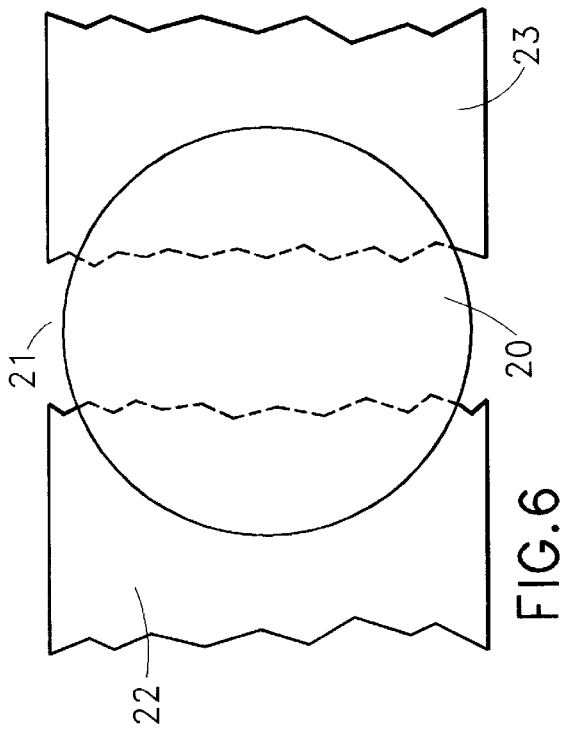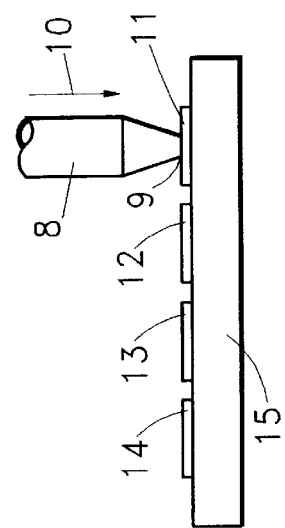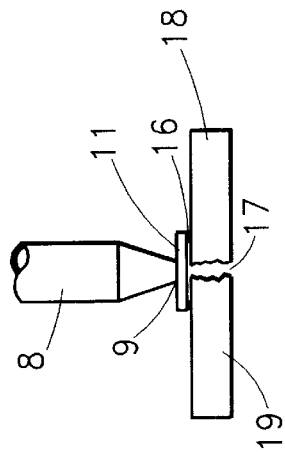

MICRO-SCALE PART POSITIONING BY SURFACE INTERLOCKING

FIELD OF THE INVENTION

The invention relates to the bonding on a micro level of the order of 10–100 micrometers of a metallic bridging member positioned across an interruption in a metal member on a substrate. The invention is used for such purposes as repair of breaks in conductors and joining of alternate circuitry.

BACKGROUND OF THE INVENTION AND RELATION TO THE PRIOR ART

In the development of the technology of downsizing electronic apparatus, examples of which are; flat panel displays, arrays of switching or storage elements and discrete wiring, the trend in reduction of size is approaching conductor sizes of 100 micrometers in width and is resulting in a need for a bridging interconnection technique for a bridging element that is to be placed across an interuption in a conductive member on a substrate. The bridging element may be varied in shape and size and the location for the bridging may be such that compatibility with standard mass production techniques is limited. As two specific examples; in a first example,in large deposited wiring layouts a flaw in a single conductor can jeopardize the usefulness of the entire layout but a repair would require providing a single patch at a location in a mass produced and spaced array; and, as a second example in many arrays parallel circuitry is arranged when the array is made so that the parallel circuitry can be connected in as a repair for a failure in a portion of the array. In each of these types of examples a single location must be found and a bridging member connected in that joins conductive members. Such an operation requires a technique developing in the art of single point microbonding.

Single point microbonding requires precise alignment and positioning of the elements to be bonded. The operation has to take place at a location governed by what is being repaired or bridged and seldom can be predicted in advance, and the precise shape and size of the bridging part that will be needed also cannot be predicted. In some applications spheres are involved while in others small discs and pieces of wire are used.

There has been some attention directed to ball and line repair in the art.

For repair of interruptions in thin film lines. In one technique microwire segments are fabricated on thin polymer carriers and the polymer sheet is manipulated so that the microwire is located exactly over the interruption and bonded in place. This technique is illustrated in U.S. Pat. No. 5,079,070. In another technique a conductive repair patch is transported and released into a prepared location by a carrier tool. This technique is illustrated in U.S. Pat. No. 5,289,632.

In still another technique, in active line repair in display circuitry, a disc is bonded across two adjacent pads so positioned for connecting in alternate circuitry. This technique is illustrated in U.S. Ser. No. 08 (639,583) Apr. 29, 1996.

For repair of a missing solder ball in a pad array involving a chip, a solder ball is melted and attached to a heating tip coated with a solder wetting material then positioned and attached on the defective pad. This technique is illustrated in IBM TDB Vol. 39 No. 7 July 1996 p. 281.

At present no tool has been developed that is versatile enough to handle the many bridging shapes and be able to place them in the one at a time unique locations in the various applications without retooling and the sizes are much too small for any manual operations.

SUMMARY OF THE INVENTION

The invention employs a principle of surface interlocking wherein the imperfections of two parallel surfaces deform and interlock under pressure. The surface interlocking enables the combination of a bridging element and a bonding tip of a diffusion bonding apparatus to pick up, transport, position at a unique location, and bond the bridging element in place to the conductors or pads. In the invention a single point bonding tip as part of a bonding apparatus is used to pick up the, to be, bridging metal object transport it to the bonding site and perform the entire bridging bonding operation all in one sequence of steps.

BRIEF DESCRIPTION OF THE DRAWINGS

FIG. 1 is a schematic diagram opposing metal surfaces to be pressed together illustrating the typical surface imperfections on such surfaces.

FIG. 2 is a depiction of the interlocking, under pressure, of surface imperfections on opposing surfaces.

FIG. 3 is an illustration showing the tip of a bonding apparatus, picking up from a supply tray, a bridging member.

FIG. 4 is an illustration of the tip of a bonding apparatus transporting a bridging member.

FIG. 5 is an illustration of a bridging member in contact with the bonding tip and bonded into position across an interruption in a conductor.

FIG. 6 is a top view of a bridging member at a connection intersection between pads.

FIG. 7 is a side view of a bridging member at a connection intersection between pads.

DESCRIPTION OF THE INVENTION

In the invention the fact that opposing metal surfaces will have some interlocking take place when they are pressed together has been found to provide sufficient retention to be able to pick up, transport and position an object of the order of the size of a deposited conductor bridging member used in electronic apparatus. The interlocking retention force is versatile in that there is no limitation to shape and size of the bridging object so long as the weight is below the weight for the interlocking force to hold. It is predictable, whereas a static electricity force is generally unpredictable, and in fact the parts of positioning apparatus are usually grounded, as by a connection through the apparatus between elements 3 and 4 of FIG. 1 to prevent inadvertent static attraction from interfering.

In using the interlocking retention force, the available magnitude is related to the dimensions and weight of the bridging part to be positioned and bonded. For perspective, for an aluminum bridging part to be positioned, the size would be of the order of approximately up to 100 micrometers across and approximately 35 micrometers thick. It would weigh approximately 0.5 microgram. The minimum interlocking surface area that would be needed to retain that weight, is calculated to be of the order of approximately 40 square nanometers which is far less than the interlocking surface area that would be available with a bonding tip diameter of approximately 50 micrometers.

Further, hypothesis would indicate, that there would be retention capability for aluminum discs weighing up to a few milligrams when pressed with a force of approximately 1 gram against the, end of a tungsten bonding tip with approximately a 100 micrometer tip diameter.

Referring to FIG. 1 there is shown a schematic diagram of opposing surfaces 1 and 2 that are on bodies 3 and 4 of metal that are to be pressed together. The surfaces 1 and 2 have exaggerated irregularities to illustrate the typical surface imperfections found on ordinary machined, rolled or extruded metal surfaces. When the surfaces 1 and 2 are pressed together the imperfections deform and interlock, so that a force is required to separate them.

Referring to FIG. 2 there is shown a depiction of a the interlocking, under pressure, of surface imperfections on opposing surfaces. In FIG. 2, on one surface there is an example embossed imperfection 5 that interdigitates with a recessive imperfection 6 on the opposing body. Under the compressive force bringing the bodies together there is some deformation, an increment of which is 7 and which over the entire area would require a force to separate and would support some weight.

In accordance with the invention the retention force when a metal tip of a bonding apparatus is pressed against a thin metal film bridging element the bridging element will be retained on the tip while being transported, positioned for bonding and then bonded.

In the FIG. 3, there is shown an illustration of a tip 8 of a bonding apparatus of the type standard in the art (not shown) with a contact portion 9 in compressive force contact indicated by an arrow 10 with a bridging member 11. The bridging member 11 is part of a group of bridging members 12–14 on a supply tray 15 in serial position for being picked up by the tip 8 of the bonding apparatus.

Referring to FIG. 4 there is shown an illustration of the tip 8 transporting the picked up bridging part 11. The bridging part 11 is retained on the contact portion 9 of the tip 8 by the force required to separate the interlocking of the imperfections on the tip and the bridging member produced by the compressive force applied when the bridging part 11 was picked up.

Referring to FIG. 5 there is shown an illustration of a bridging member 11 positioned by the bonding apparatus (not shown) of which the tip 8 is a part and bonded at 16 across an interruption 17 between conductor parts 18 and 19. In accordance with the invention, the bridging member 11, retained by interlocking, on the contact portion 9 of the tip 8, is positioned by the bonding apparatus (not shown) of which the tip 8 is a part, is positioned across the interruption 17 between conductor parts 18 and 19 and a bond 16 is formed to each of the conductor parts 18 and 19 bonding energy of heat and possibly vibration bonding conditions supplied through the tip 8 by the bonding apparatus, thereby providing electrical continuity between the parts 18 and 19 through the bridging member 11. The bonding conditions and the apparatus to provide them have received attention in the art. A preferred technique and apparatus is described in copending application Ser. No. 08/796,767 filed Feb. 6, 1997 in which the applied heat in the presence of ultrasonic vibration can be precisely controlled.

In positioning bridging members in arrays, there are pad arrangements for externally applied repair bridges that can be used to route wiring into alternative paths to avoid a failure in the array. The capability of the invention is very efficient in bringing a bridging member to such a pad arrangement location and performing the bonding. Once the bonding is complete, the force that is needed to disengage the interlocking of the bridging member and the tip is very small compared to the bond strength and does not interfere with the bond between the bridging member and the conductor when the tip is removed.

Referring to FIGS. 6 and 7 there are shown a top view and a side view of a bridging member 20 bonded in place at a connection intersection 21 between pads 22 and 23 each connected to parts of a wiring array (not shown), after the tip 8, the contact portion 9 of which would overlap the pads 22 and 23 has been removed. The bridging member 20 is shown as a disc which is a relatively easier shape to punch out but one skilled in the art would not be limited to a particular shape. In large arrays the capability provided by the invention of being able to hold on to the bridging member as it is brought to the bridging location and then to produce the bonds to each pad greatly simplifies the bridging operation.

What has been described is the use of surface interlocking of imperfections in the surfaces of a bridging element and a bonding tip of a bonding apparatus under pressure to pick up, transport, position, and bond the bridging element in place to the conductors or pads.

What is claimed is:

1. The improvement in the micro-scale bonding of a bridging element across an interruption between conductive members in circuitry in electronic apparatus comprising:

delivering bonding energy through a bonding tip positioned across said interruption to which a micro-scale bridging element is attached to the contacting surface thereof through the application of pressure between said contacting surface of said bonding tip and said bridging element sufficient to produce interlocking by deformation of imperfections in at least one of said contacting surface and said bridging element.

2. The improvement of claim 1 wherein said contacting surface of said bonding tip extends over each said conductive member and across said interruption.

3. The improvement of claim 2 wherein said bonding energy includes heat and vibration.

4. The method of micro-scale bonding of a bridging element across an interruption between conductive members in circuitry in electronic apparatus, comprising in combination the steps of:

attaching a micro-scale bridging element to the contacting surface of a bonding tip in a bonding apparatus by applying pressure between said contacting surface of said bonding tip and said bridging element sufficient to produce interlocking by deformation of imperfections in at least one of said contacting surface and said bridging element, positioning the combination of said bonding tip with said attached bridging element across said interruption and in contact with said conductive members, and delivering bonding energy through said bonding tip operable to form a bond between said bridging element and each said conductor.

5. The method of claim 4 wherein said contacting surface of said bonding tip extends across said interruption and over each said conductor.

6. The method of bonding a bridging member across an interruption between conductor portions in circuitry in electronic apparatus, comprising in combination the steps of:

attaching said bridging member to the contacting surface of a bonding tip in a bonding apparatus by applying pressure between said contacting surface of said bonding tip and said bridging member sufficient to produce interlocking by deformation of imperfections in at least one of said contacting surface and said bridging member, and, delivering sufficient bonding energy through the combination of said bonding tip and said bridging member when in position across said interruption and in contact with said conductive members, to form a bond between said bridging member and each said conductor.

7. The method of claim 6 wherein in said step of attaching said bridging member, said bridging member is a disc.

8. The method of claim 7 wherein said interruption includes two adjacent pads.

9. A method of providing a conductor bridging over a break in a conductor comprising in combination the steps of:

attaching said conductor to the bonding surface of a bonding apparatus tip by applying pressure between said bonding apparatus tip and said conductor
said pressure being sufficient to produce interlocking by deformation of imperfections in at least one of said bonding surface and said conductor delivering bonding energy through the combination of said bonding apparatus tip and said conductor when said conductor is in position across said break and in contact with said conductor,
said bonding energy being sufficient to form a bond between said conductor and a portion of said conductor on each side of said break.

10. The method of claim 9 wherein said bonding energy is heat and vibration.

11. The method of claim 9 wherein said break is side by side pads.

12. The improvement of claim 1 wherein said contacting surface of said bonding tip and said bridging element is about 40 square nanometers for a 0.5 microgram weight of said bridging element.

13. The improvement of claim 3 wherein said microscale bridging element is an aluminum member of about 100 micrometers across and about 35 micrometers thick weighing about 0.5 microgram.

14. The method of claim 8 wherein said bridging member has a contacting surface of about 40 square nanometers for a 0.5 microgram weight of said bridging member.

15. The method of claim 9 wherein said interlocking by deformation of imperfections occurs over an about 40 square nanometer surface for a 0.5 microgram weight bridging conductor.

16. The method of claim 11 wherein said bridging conductor is an aluminum member of about 100 micrometers across and about 35 micrometers thick weighing about 0.5 microgram.

* * * * *